# United States Patent
Silver et al.

(10) Patent No.: US 6,535,437 B1
(45) Date of Patent: *Mar. 18, 2003

(54) BLOCK REDUNDANCY IN ULTRA LOW POWER MEMORY CIRCUITS

(75) Inventors: John J. Silver, Monument, CO (US); Iulian C. Gradinariu, Colorado Springs, CO (US); Bogdan I. Georgescu, Colorado Springs, CO (US); Keith A. Ford, Colorado Springs, CO (US); Sean B. Mulholland, Colorado Springs, CO (US); Danny L. Rose, Monument, CO (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/882,898

(22) Filed: Jun. 15, 2001

Related U.S. Application Data

(63) Continuation of application No. 09/461,632, filed on Dec. 15, 1999, now Pat. No. 6,249,464.

(51) Int. Cl.$^7$ .................................................. G11C 7/00
(52) U.S. Cl. ........................ 365/200; 365/226; 365/227
(58) Field of Search ................................. 365/200, 201, 365/225.7, 227, 230.03, 230.06, 226, 189.01

(56) References Cited

U.S. PATENT DOCUMENTS

| | | | |
|---|---|---|---|
| 4,281,398 A | 7/1981 | McKenny et al. | 365/200 |
| 4,587,639 A | 5/1986 | Aoyama et al. | 365/200 |
| 4,604,730 A | 8/1986 | Yoshida et al. | 365/200 |
| 4,908,798 A | 3/1990 | Urai | 365/230.03 |
| 5,235,548 A | 8/1993 | Kurkowski | 365/200 |
| 5,262,993 A | 11/1993 | Horiguchi et al. | 365/200 |
| 5,293,348 A | 3/1994 | Abe | 365/230.03 |
| 5,349,557 A | 9/1994 | Yoshida | 365/200 |
| 5,390,150 A | 2/1995 | Kwak et al. | 365/227 |

(List continued on next page.)

OTHER PUBLICATIONS

"Fault Tolerance in VLSI Circuits", By Israel Korean and Adit D. Singh, IEEE Computer, Jul. 1990, pp. 73–83.
"A 2.5-V 2.0-Gbyte/s 288-Mb Packet-Based DRAM with Enhanced Cell Efficiency and Noise Immunity", By Kye-Hyun Kyung et al., IEEE Journal of Solid-State Circuits, vol. 36, No. 5, May 2001, pp. 735–743.
"Abnormal Leakage Suppression (ALS) Scheme for Low Standby Current SRAMs", By Kouichi Kanda et al., 2001 IEEE International Solid-State Circuits Conference, Feb. 6, 2001, Ten pages.
"A Circuit Technology for High-Speed Battery-Operated 16-Mb CMOS DRAM's", By Hiroyuki Yamauchi et al., IEEE Journal of Solid-State Circuits, vol. 28, No. 11, Nov. 1993, pp. 1084–1091.
"Yield Optimization in Large RAM's with Hierarchical Redundancy", By Kumar N. Ganapathy et al., IEEE Journal of Solid-State Circuits, vol. 26, No. 9, Sep. 1991, pp. 1259–1264.
"SOI-DRAM Circuit Technologies for Low Power High Speed Multigiga Scale Memories", By Shigehiro Kuge et al., IEEE Journal of Solid-State Circuits, vol. 31, No. 4, Apr. 1996, pp. 586–591.

(List continued on next page.)

Primary Examiner—David Lam
(74) Attorney, Agent, or Firm—Christopher P. Maiorana, P.C.

(57) ABSTRACT

A circuit comprising a memory array and a logic circuit. The memory array may be configured to read or write data in response to (i) one or more enable signals and (ii) one or more control signals. The logic circuit may be configured to generate the enable signals in response to one or more address signals. De-assertion of one or more of the enable signals generally reduces current consumption in the memory array.

23 Claims, 6 Drawing Sheets

U.S. PATENT DOCUMENTS

| | | | |
|---|---|---|---|
| 5,402,376 A | 3/1995 | Horiguchi et al. | 365/200 |
| 5,487,041 A | 1/1996 | Wada | 365/200 |
| 5,502,674 A | 3/1996 | Griffus et al. | 365/200 |
| 5,523,975 A | 6/1996 | Reddy | 365/200 |
| 5,581,508 A | 12/1996 | Sasaki et al. | 365/200 |
| 5,621,690 A * | 4/1997 | Jungroth et al. | 365/185.09 |
| 5,671,189 A | 9/1997 | Ting et al. | 365/229 |
| 5,673,231 A | 9/1997 | Furutani | 365/203 |
| 5,691,952 A | 11/1997 | Sasaki et al. | 365/230.08 |
| 5,706,231 A | 1/1998 | Kokubo | 365/200 |
| 5,748,520 A | 5/1998 | Asaka et al. | 365/149 |
| 5,796,664 A | 8/1998 | Tsuruda et al. | 365/200 |
| 5,798,974 A | 8/1998 | Yamagata | 365/200 |
| 6,058,052 A | 5/2000 | Steadman | 365/200 |
| 6,125,067 A | 9/2000 | Waller et al. | 365/200 |
| 6,134,177 A | 10/2000 | Kang | 365/230.06 |
| 6,201,745 B1 | 3/2001 | Ryu et al. | 365/200 |
| 6,208,570 B1 * | 3/2001 | Brown et al. | 365/201 |
| 6,212,118 B1 | 4/2001 | Fujita | 365/222 |
| 6,215,699 B1 | 4/2001 | Yamamoto | 365/189.09 |
| 6,249,464 B1 * | 6/2001 | Silver et al. | 365/200 |

OTHER PUBLICATIONS

"High–Speed, High–Reliability Circuit Design for Megabit DRAM", By Peter Gillingham et al., IEEE Journal of Solid–State Circuits, vol. 26, No. 8, Aug. 1991, pp. 1171–1175.

"Fault–Tolerant Designs for 256 Mb DRAM", By Toshiaki Kirihata, et al., IEEE Journal of Solid–State Circuits, vol. 31, No. 4, Apr. 1996, pp. 558–566.

"Redundancy Techniques for High–Density DRAMs", By Masashi Horiguchi, 1996 Innovative Systems in Silicon Conference, 1997 IEEE, pp. 22–29.

"Column Redundancy Scheme for Multiple I/O DRAM Using Mapping Table", By Yong–Weon Jeon et al., Electronics Letters, May 25, 2000, vol. 36, No. 11, pp. 940–942.

"A New Column Redundancy Scheme For Fast Access Time of 64–Mb DRAM", By Young–Hyun Jun et al., 1993 IEEE International Symposium on Circuits and Systems, May 3–6, 1993, pp. 1937–1940.

"A 6.5ns 1Mb BiCMOS ECL SRAM", By Yasuhiko Maki et al., 1990 IEEE International Solid–State Circuits Conference, Feb. 15, 1990, pp. 136–138.

"A Low Power 16k GaAs HMESFET Static RAM With Built–In Redundancy", By T. Tsen et al., GaAs IC Symposium, Technical Digest, Oct. 7–10, 1990 IEEE, pp. 155–157.

"High–Reliability Fault–Tolerant 16–Mbit Memory Chip", By C.H. Stapper et al., 1991 Proceedings Annual Reliability and Maintainability Symposium, IEEE, Jan. 29–31, 1991, pp. 48–56.

"A 16 Mb Mask ROM With Programmable Redundancy", By Yasuo Neruke et al., 1989 IEEE International Solid–State Circuits Conference, Feb. 15–17, 1989, pp. 128–129 and 311.

"I/O Divided Column Redundancy Scheme For High–Speed DRAM With Multiple I/Os", By Jae–Goo Lee et al., Electronics Letters Nov. 23, 2000, vol. 36, No. 24, pp. 1996–1997.

"A New Column Redundancy Scheme For Yield Improvement of High Speed DRAMs With Multiple Bit Pre–fetch Structure", By Jae–Goo Lee et al., 2001 Symposium on VLSI Circuits Digest of Technical Papers, Jun. 14–16, 2001, pp. 69–70.

"Design Methodology For Defect Tolerant Integrated Circuits", By Wojciech Maly, IEEE 1988 Custom Integrated Circuits Conference, May 16–19, 1988, pp. 27.5.1–27.5.4.

* cited by examiner

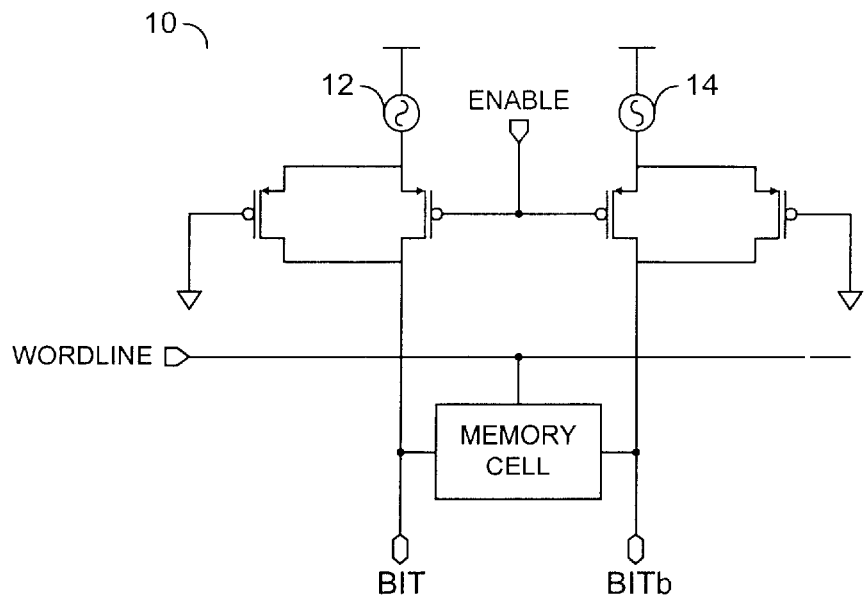
FIG. 1
(CONVENTIONAL)
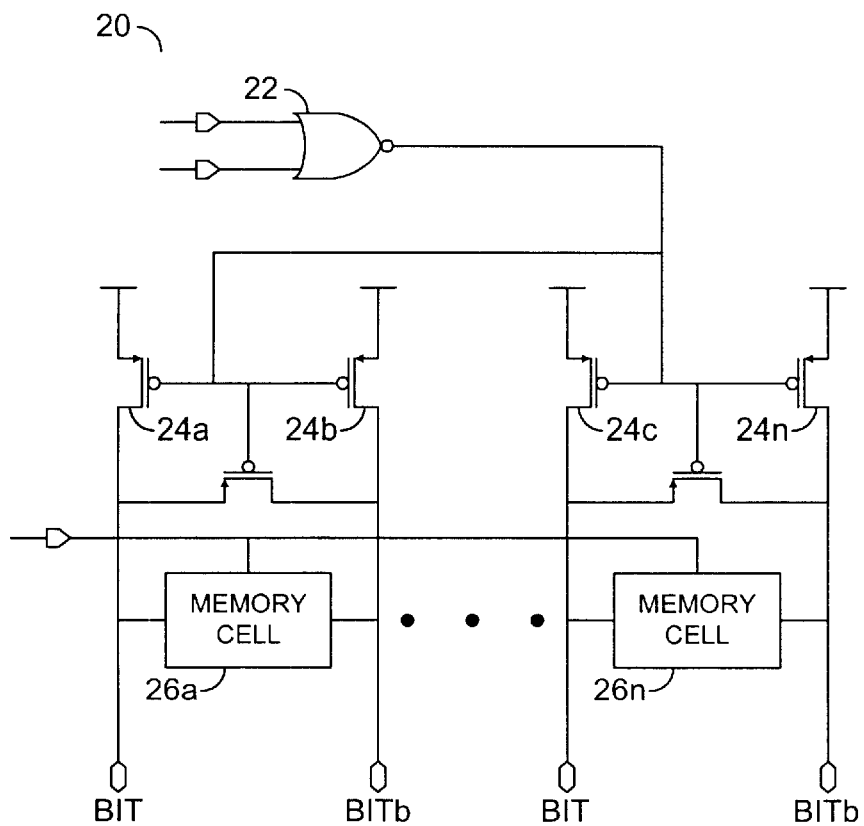
FIG. 2
(CONVENTIONAL)

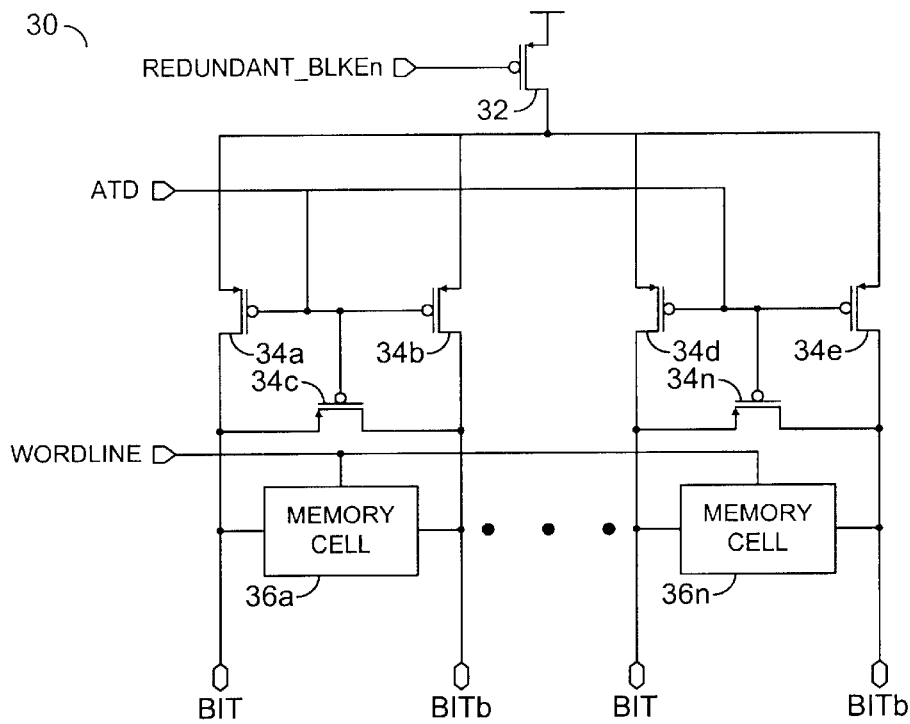
FIG. 3
(CONVENTIONAL)

BLOCK REDUNDANCY IN ULTRA LOW POWER MEMORY CIRCUITS

This is a continuation of U.S. Ser. No. 09/461,632 filed Dec. 15, 1999, now U.S. Pat. No. 6,249,464.

FIELD OF THE INVENTION

The present invention relates to block redundancy generally and, more particularly, to a block redundancy method and/or architecture that may be used with ultra low power memory circuits.

BACKGROUND OF THE INVENTION

Conventional block redundancy circuits may disconnect defective bitlines from a power supply using either fuses or gated loads. Conventional block redundancy circuits (i) only address standby current related to bitline defects, (ii) do not address defects related to intercell problems and (iii) are costly from a die area point of view.

Referring to FIG. 1, a conventional circuit 10 used for block and/or column redundancy is shown. The circuit 10 comprises a fuse 12 and a fuse 14. The fuses 12 and 14 disconnect defective bitlines BIT and BITB from the power supply of the circuit 10.

Referring to FIG. 2, another conventional circuit 20 used for block redundancy is shown. The circuit 20 comprises a gate 22, 5 a number of transistors 24a–24n and a number of memory cells 26a–26n. The transistors 24a–24n disconnect defective bitlines BIT and BITB from the power supply of the circuit 20. The transistors 24a–24n are controlled by the gate 22.

Referring to FIG. 3, another conventional circuit 30 for block redundancy is shown. The circuit 30 comprises a transistor 32, a number of transistors 34a–34n and a number of memory cells 36a–36n. The transistor 32 supplies power to the circuit 30. The transistors 34a–34n are coupled between the power supply and the bitlines BIT and BITB. The transistors 34a–34n control the power supplied to the bitlines BIT and BITB. Transistor 32 disconnects the power supply of circuit 30 from the defective bitlines BIT and BITB.

SUMMARY OF THE INVENTION

The present invention concerns a circuit comprising a memory array and a logic circuit. The memory array may be configured to read or write data in response to (i) one or more enable signals and (ii) one or more control signals. The logic circuit may be configured to generate the enable signals in response to one or more address signals. De-assertion of one or more of the enable signals generally reduces current consumption in the memory array.

The objects, features and advantages of the present invention may include implementing a method and/or architecture that may (i) allow a power supply to be completely decoupled from a memory array, including Vcc, bitlines and their associated wells, (ii) eliminate contribution to standby current caused by memory array defects, (iii) allow the power supply to be decoupled from sub wordline driver, bitline loads and sense amplifiers, (iv) disable operation of block write functions, (v) eliminate contribution of a defective block to operational current, and/or (vi) increase die area efficiency.

BRIEF DESCRIPTION OF THE DRAWINGS

These and other objects, features and advantages of the present invention will be apparent from the following detailed description and the appended claims and drawings in which:

FIG. 1 is a conventional circuit for block and/or column redundancy;

FIG. 2 is another conventional circuit for block redundancy;

FIG. 3 is another conventional circuit for block redundancy;

DETAILED DESCRIPTION OF THE PREFERRED EMBODIMENTS

In ultra low power designs, parasitic DC current caused by defects should be eliminated. The elimination of parasitic DC current is necessary to maintain low standby current (<10 uA) on repaired devices. The present invention may allow for the total replacement of a defective memory array and cell while maintaining ultra-low standby current.

Figure 4:
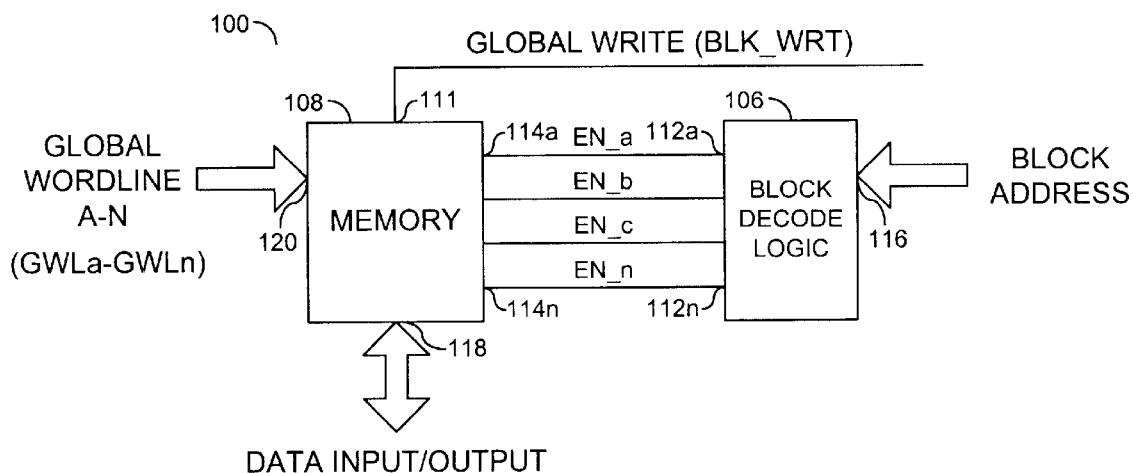
FIG. 4 is a block diagram of a preferred embodiment of the present invention.

Referring to FIG. 4, a block diagram of a circuit 100 is shown in accordance with a preferred embodiment of the present invention. The circuit 100 may completely eliminate power consumption of a memory array (to be described in connection with FIGS. 5–7). The circuit 100 may work in conjunction with double wordline memory cells, in which the n-well and Vcc supply run parallel to the bitlines. The circuit 100 may be implemented as an architecture with multiple memory blocks. In one example, the circuit 100 may be implemented as an architecture with 16 columns per memory block. However, the circuit 100 may implement any number of columns and/or granularity in order to meet the criteria of a particular implementation.

The circuit 100 may comprise a decode logic block (or circuit) 106 and a memory array (or circuit) 108. A global write signal (e.g., BLK_WRT) may be presented to an input 111 of the memory 108. The global write signal BLK_WRT may enable the memory 108 to write data. The decode logic circuit 106 may present a number of enable signals (e.g., EN_a–EN_n) at a number of outputs 112a–112n, respectively. The memory array 108 may have a number of inputs 114a–114n that may receive the signals EN_a–EN_n, a data input/output 118 and an input 120 that may receive a number of global wordline signals (e.g., GWLa–GWLn). The signals EN_a–EN_n may enable a particular memory block within the memory array 108 to read or write data (to be described in more detail in connection with FIGS. 7 and 8). The decode logic circuit 106 may generate the signals EN_a–EN_n in response to an address signal (e.g., BLOCK ADDRESS) received at an input 116. The signal BLK_WRT may control writing of data to the memory array 108.

Figure 5:
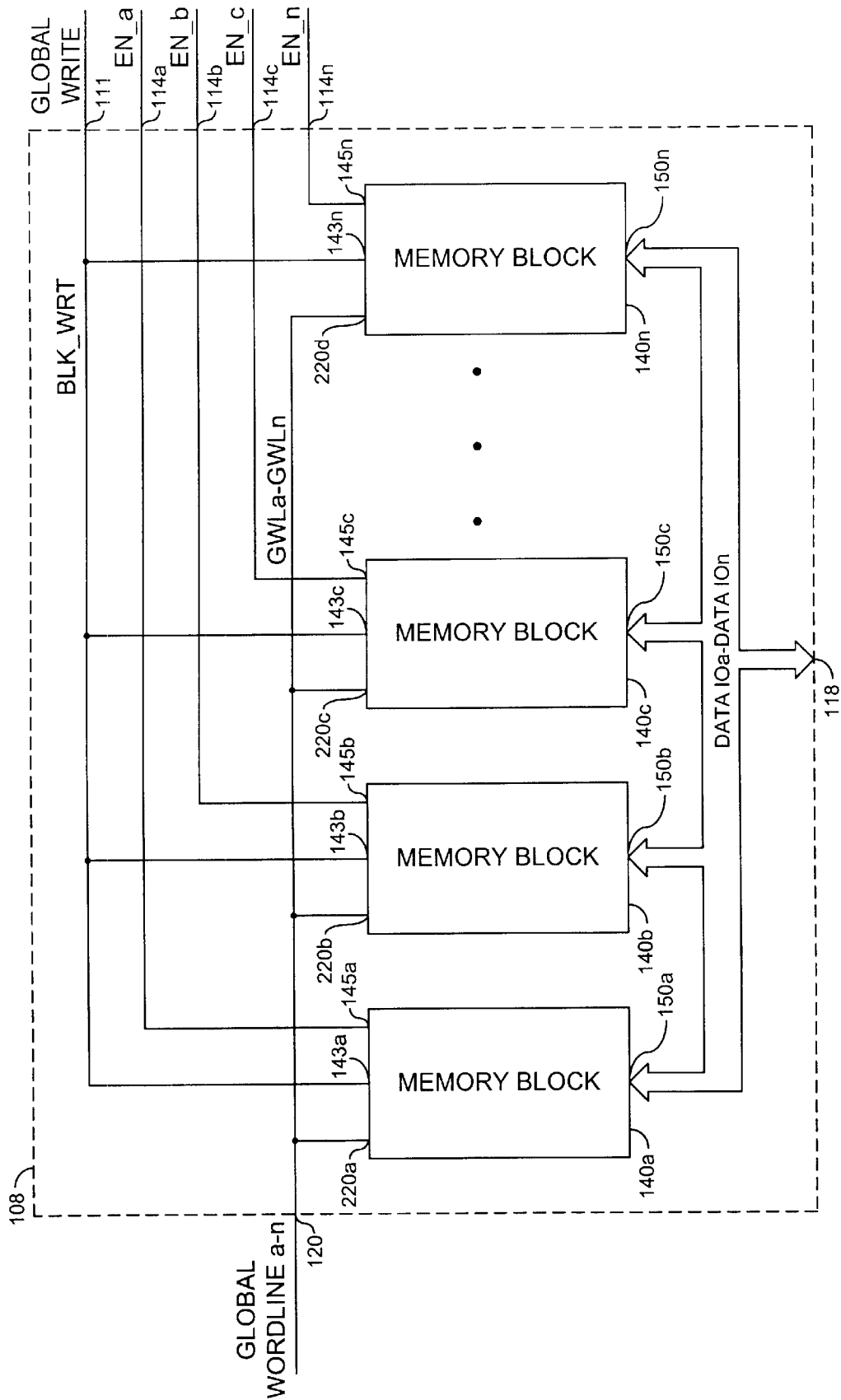
FIG. 5 is a detailed block diagram of the memory block of FIG. 4.

Referring to FIG. 5, a detailed diagram of the memory array 108 is shown. The memory array 108 may comprise a number of memory blocks 140a–140n. The memory blocks 140a–140n may each receive the signal BLK_WRT at a number of inputs 143a–143n. The memory blocks 140a–140n may each receive one of the signals EN_a–EN_n at a number of inputs 145a–145n, respectively. The signals EN_a–EN_n may be implemented as enable signals and may enable the memory blocks 140a–140n. The memory blocks 140a–140n may be connected through a number of connections (e.g., DATAIOa–DATAIOn) . The connections DATAIOa––DATAIOn may be connected to each memory section 140a–140n through a number of input/outputs 150a–150n. The memory blocks 140a–140n may each receive a number of global wordline signals (e.g., GWLa–GWLn) at a number of inputs 220a–220n.

Figure 6:
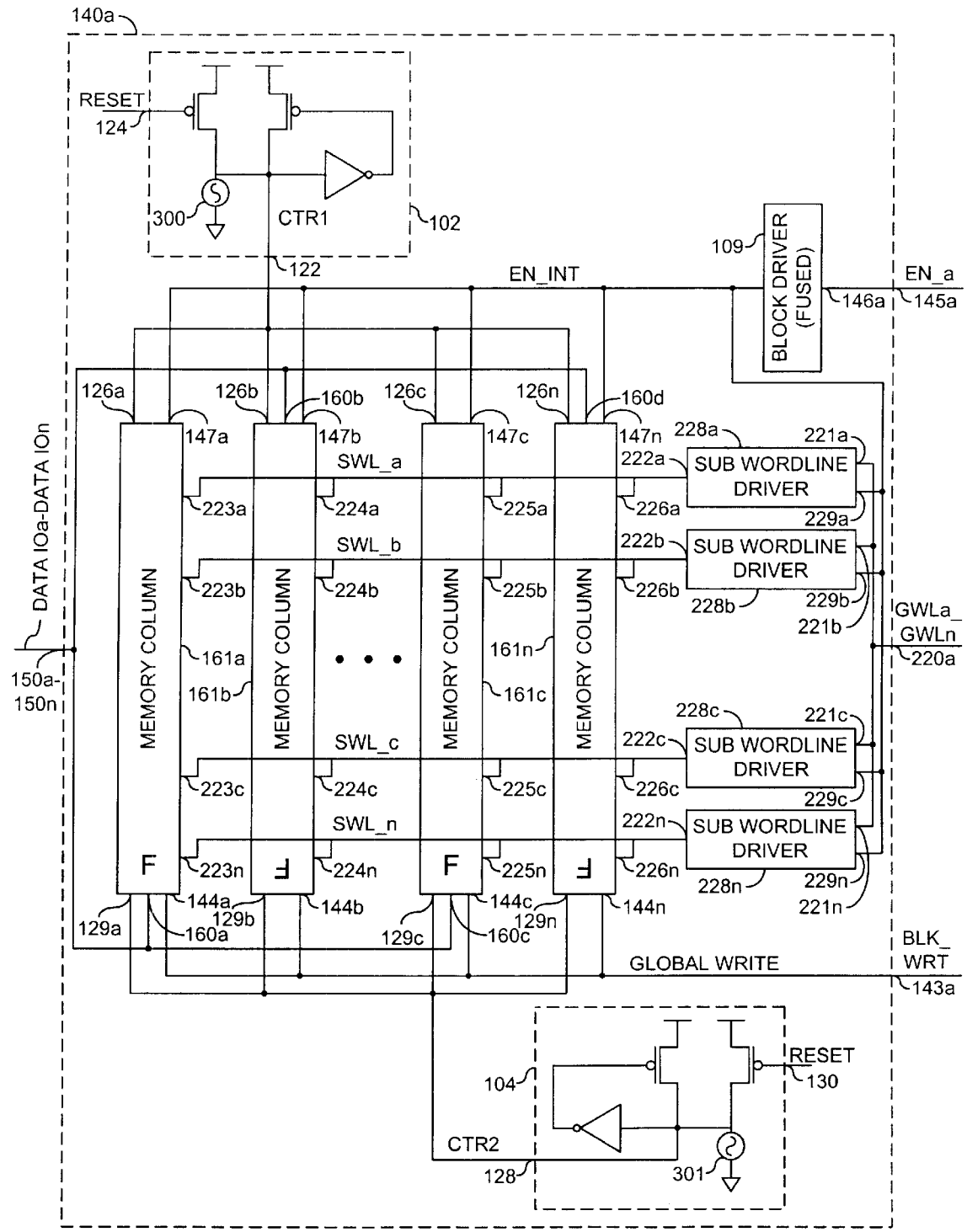
FIG. 6 is a detailed circuit diagram of the memory block of FIG. 5.

Referring to FIG. 6 a detailed diagram of a memory block 140a is show n. The memory block 140a may comprise a number of memory columns 161a–161n, a fuse latch 102, a fuse latch 104, a number of sub-wordline drivers 228a–228n, and a fused block driver block (or circuit) 109. The fuse latch 102 may have an output 122 that may present a signal (e.g., CTR1) to a number of inputs 126a–126n of the memory columns 161a–161n. The fuse latch 102 may present the signal CTR1 in response to the state of a fuse 300. With the fuse 300 in place, the signal CTR1 is generally disabled (e.g., de-asserted). With the fuse 300 removed, the signal CTR1 will generally be enabled (e.g., asserted) in response to a signal (e.g., RESET) received at an input 124. The fuse latch 104 may be similar to the fuse latch 102. The fuse latch 104 may have an output that may present a signal (e.g., CTR2) to one or more inputs 129a–129n of the memory columns 161a–161n. The fuse latch 104 may present the signal CTR2 in response to a state of a fuse 301.

With the fuse 301 in place, the signal CTR2 may be considered disabled (e.g., de-asserted). With the fuse 301 removed, the signal CTR2 may be considered enabled (e.g., asserted) in response to the signal RESET at an input 130. The signal CTR1 and the signal CTR2 may control the current supplied to the memory block 108. The signals EN_a–EN_n, the signal CTR1 and the signal CTR2 may have a first, asserted state that is generally "on" (e.g., a digital HIGH, or 1) and a second, de-asserted state that is generally "off" (e.g., a digital LOW, or 0). However, the particular polarities of the on (e.g., asserted) and off (e.g., de-asserted) states may be adjusted (e.g., reversed) accordingly to meet the design criteria of a particular implementation.

The memory block 140a may also receive the signal BLK_WRT at the input 143a . The signal BLK_WRT may be presented to the memory columns 161a–161n at inputs 144a–144n, respectively. The memory block 140a may receive the signal EN_a at an input 145a. The signal EN_a may also be presented to an input 146a of the block driver circuit 109. The block driver circuit 109 may essentially control the operation and current consumption of the memory block 140a. In one example, the memory block 140a may be implemented as a twin well memory block. The twin well memory block 140a may allow the block driver circuit 109 to control the ground voltage (e.g., a virtual ground VSS) of the circuit 140a in addition to or in place of controlling the supply voltage (e.g., VCC). The block driver circuit 109 may essentially control the operation of memory block 140a . The block driver circuit 109 may be disabled with a self-contained fuse (described in more detail in connection with FIG. 8). An intact fuse may allow the enable signal EN_a to propagate through to the memory columns 161a–161n . A removed (e.g., blown) fuse may disable a signal (e.g., EN_int) which may disable the memory block 140a. The memory columns 161a–161n may receive the signal EN_int from the block driver circuit 109. The memory 140a may have a number of input/outputs 150a–150n that may receive the signals DATAIOa––DATAIOn.

The sub-wordline drivers 228a–228n may receive the global wordline signals GWLa–GWLn at a number of inputs 221a–221n, respectively. The sub-wordline drivers 228a–228n may receive the enable signal EN_int at a number of inputs 229a–229n. The memory columns 161a–161n may receive signals (e.g., SWL_a–SWL_n) from a number of outputs 222a–222n of the sub-wordline drivers 228a–228n. Each sub-wordline driver 228a–228n may be powered down with minimal effect to die area. An example of a sub-wordline driver may be found in co-pending application Ser. No. 09/398,735, filed Sep. 17, 1999 (now U.S. Pat. No. 6,163,495), which is hereby incorporated by reference in its entirety. The input/outputs 150a–150n may be connected to the memory columns 161a–161n at the input/outputs 160a–160n, respectively.

Figure 7:
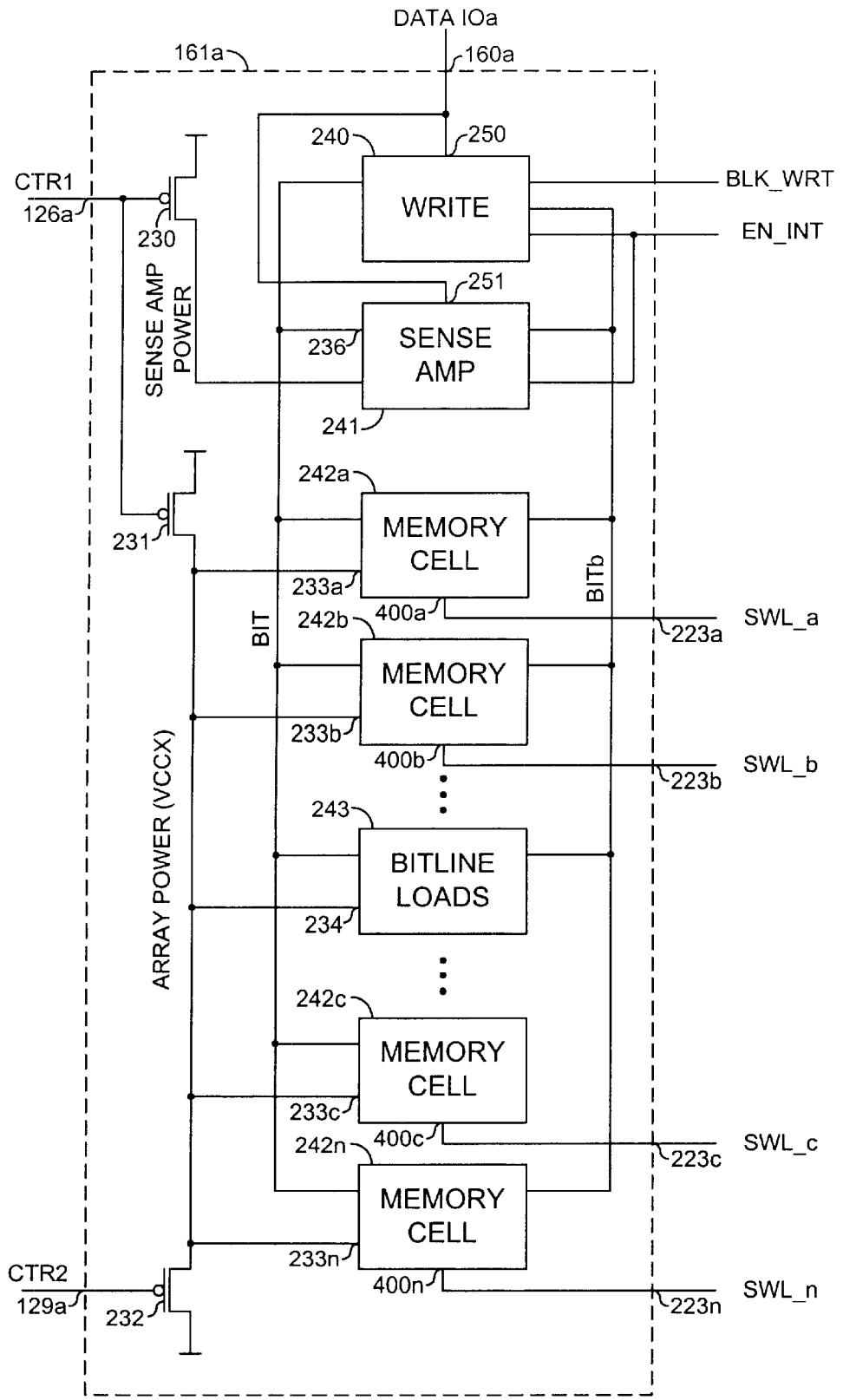
FIG. 7 is a detailed circuit diagram of the memory array of FIG. 6.

Referring to FIG. 7 a detailed block diagram of the memory column 161a of FIG. 6 is shown. The memory column 161a may comprise a number of memory cells 242a–242n, a number of bitline load blocks (or circuits) 243 (only one bitline load is shown for clarity of the illustration), a sense amplifier 241, a write block (or circuit) 240, a transistor 230, a transistor 231 and a transistor 232. The memory cells 242a–242n, the bitline load circuit 243, the sense amplifier 241 and the write circuit 240 may be connected through a bitline (e.g., BIT) and a complementary bitline bar (e.g., BITB).

The transistors 230, 231 and 232 may be implemented as P-type transistors or any other type transistor necessary to meet the criteria of a particular implementation. The transistor 230 may essentially control the supply voltage to the sense amplifier 241. The transistors 231 and 232 may remove the supply voltage VCC from the memory cells 242a–242n and the bitline load 243. The transistors 230, 231 and 232 may eliminate current contribution of a defective block to the overall operational current.

The signal CTR1 may be presented to the gate of the transistor 230 and the gate of the transistor 231. The source of the transistor 231 may be connected to the supply voltage VCC. The drain of the transistor 231 may be connected to (i) a number of inputs 233a–233n of the memory cells 241a–242n, (ii) an input 234 of the bitline load, and (iii) a drain of the transistor 232. The source of the transistor 232 may be connected to the supply voltage VCC. The drain of the transistor 232 may be connected to the inputs 233a–233n of the memory cells 242a–242n and the drain of the transistor 231. The drain of the transistor 230 may be connected to the input 236 of sense amplifier 241. The source of the transistor 230 may be connected to the supply voltage VCC. The signal CTR2 may be presented to the gate of the transistor 232.

The gate of transistors 230 and 231 may receive the signal CTR1.

The input/output 160a may (i) present the signal DATAIOa to the input 250 of write circuit 240 or (ii) receive the signal DATAIOa from the output 251 from sense amplifier 241. The sub-wordline signal inputs 223a–223n may be presented to a number of inputs 400a–400n of the memory cells 242a–242n.

Figure 8:
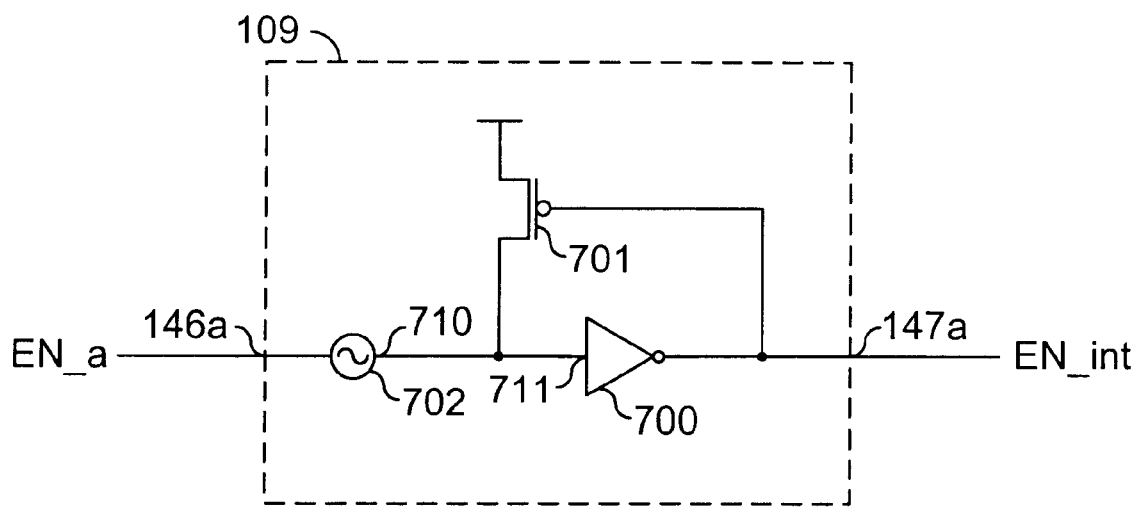
FIG. 8 is a detailed circuit diagram of the block driver circuit of FIG. 6.

Referring to FIG. 8 a detailed block diagram of the block driver logic circuit 109 of FIG. 6 is shown. The block driver circuit 109 generally comprises a fuse 702, an inverter 700, and a transistor 701. The block driver circuit 109 may receive the signal EN_a at the input 146a . The signal EN_a may be presented to the fuse 702. The block driver 109 may present the enable signal EN_int at the output 147a. The input/output 710 of fuse 702 may be connected to the input of the inverter 700 and the drain of the transistor 701. The output of the inverter 700 may be connected to the gate of transistor 701.

The present invention may provide a redundancy scheme for use in ultra-low power memory circuits. In ultra-low power designs, parasitic DC current caused by defects must generally be eliminated to maintain low standby current (e.g., <10 uA) on repaired devices. The present invention may allow for the total replacement of defective blocks of memory while maintaining ultra-low standby current.

While the invention has been particularly shown and described with reference to the preferred embodiments thereof, it will be understood by those skilled in the art that various changes in form and details may be made without departing from the spirit and scope of the invention.

What is claimed is:

1. A circuit comprising:
   a memory array comprising a plurality of memory cells and one or more redundant memory cells, wherein said memory array is configured to read or write data in response to (i) one or more enable signal s and (ii) one or more control signals; and
   a logic circuit configured to (i) generate said one or more enable signals in response to one or more address signals and (ii) de-assert said one or more enable signals to reduce current consumption in said memory array.

2. The circuit according to claim 1, wherein said logic circuit comprises a block decode logic circuit.

3. The circuit according to claim 1, wherein each of said one or more enable signals comprise local enable signals.

4. The circuit according to claim 1, wherein said memory array is further configured to read and write data in response to a global signal.

5. The circuit according to claim 4, wherein said global signal comprises a global write control signal.

6. The circuit according to claim 1, wherein said memory array is configured to read or write data in further response to one or more global wordline signals.

7. The circuit according to claim 1, wherein said logic circuit is configured to control the reading of data from or writing of data to one or more of said redundant memory cells and one or more replaced memory cells in response to said one or more enable signals.

8. The circuit according to claim 7, further comprising:
   a first latch circuit configured to generate a first control signal of said one or more control signals; and
   a second latch circuit configured to generate a second control signal of said one or more control signals.

9. The circuit according to claim 8, wherein said first and second latch circuits each comprise a plurality of transistors configured to reduce current consumption contributed by said one or more replaced memory cells.

10. The circuit according to claim 9, wherein said plurality of transistors comprises P-channel transistors.

11. The circuit according to claim 1, wherein said memory array further comprises a plurality of storage elements each comprising one or more bitlines, one or more complementary bitlines and one or more bitline load circuits.

12. The circuit according to claim 11, wherein said memory array further comprises one or more write circuits and one or more sense amplifier circuits configured to control the reading of data from and writing of data to said memory array.

13. The circuit according to claim 12, wherein each of said storage elements further comprises a block driver, wherein said block driver is configured to disable said one or more write circuits and said one or more sense amplifier circuits in order to reduce current consumption in said memory array.

14. The circuit according to claim 13, wherein said block driver is further configured to disable one or more wordline drivers in order to reduce current consumption in said memory array.

15. A circuit comprising:
   means for reading data from or writing data to a memory array comprising a plurality of memory cells and one or more redundant memory cells, in response to (i) one or more enable signals and (ii) one or more control signals; and
   means for generating said one or more enable signals in response to one or more address signals, wherein said generating means is configured to de-assert said one or more enable signals to reduce current consumption in said memory array.

16. A method for reading data from or writing data to a memory array comprising a plurality of memory cells and one or more redundant memory cells, comprising the steps of:
   (A) reading or writing said data in response to (i) one or more enable signals and (ii) one or more control signals;
   (B) generating said one or more enable signals in response to one or more address signals; and
   (C) de-asserting said one or more enable signals to reduce current consumption in said memory array.

17. The method according to claim 16, wherein step (A) comprises reading or writing data to one or more of said redundant memory cells in response to said one or more enable signals.

18. The method according to claim 16, wherein step (A) is performed in further response to one or more global wordline signals.

19. The method according to claim 16, wherein step (A) is further responsive to a global signal.

20. The method according to claim 16, further comprising:
   controlling one or more wordline drivers in response to said one or more enable signals.

21. The method according to claim 16, further comprising:
   controlling one or more sense amplifiers and one or more write circuits in response to said one or more enable signals.

22. A circuit comprising:
   a memory array comprising one or more memory blocks and one or more redundant memory blocks, wherein said memory array is configured to disable at least one of said one or more memory blocks and enable at least one of said one or more redundant memory blocks in response to (i) one or more enable signals and (ii) one or more control signals; and
   a logic circuit configured (i) to generate said one or more enable signals according to a block redundancy scheme and (ii) to de-assert said one or more enable signals to reduce current consumption in said memory array.

23. The circuit according to claim 22, wherein each of said one or more memory blocks and each of said one or more redundant memory blocks comprises one or more elements from the group consisting of memory cells, sense amplifiers, wordline drivers, write circuits and bitline loads.

* * * * *